(12) United States Patent
Mizuno

(10) Patent No.: US 6,535,056 B2
(45) Date of Patent: Mar. 18, 2003

(54) SEMICONDUCTOR INTEGRATED CIRCUIT DEVICE

(75) Inventor: Hiroyuki Mizuno, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 79 days.

(21) Appl. No.: 09/874,017

(22) Filed: Jun. 6, 2001

(65) Prior Publication Data

US 2001/0052800 A1 Dec. 20, 2001

(30) Foreign Application Priority Data

Jun. 16, 2000 (JP) .......................... 2000-185908
Apr. 18, 2001 (JP) .......................... 2001-119032

(51) Int. Cl.$^7$ ............................................. G05F 1/10
(52) U.S. Cl. ............................................. 327/544
(58) Field of Search ................. 327/530, 534, 327/535, 544, 545, 546

(56) References Cited

U.S. PATENT DOCUMENTS

| | | | | |
|---|---|---|---|---|
| 5,583,457 A | * | 12/1996 | Horiguchi et al. | 326/121 |
| 5,606,265 A | * | 2/1997 | Sakata et al. | 326/34 |
| 5,614,847 A | * | 3/1997 | Kawahara et al. | 326/98 |
| 5,724,297 A | * | 3/1998 | Noda et al. | 365/226 |
| 6,107,700 A | * | 8/2000 | Ishikawa et al. | 307/116 |

FOREIGN PATENT DOCUMENTS

JP            8-152945          11/1994

OTHER PUBLICATIONS

Shekhar Borkar, *Design Challenges of Technology Scaling*, Jul.–Aug. 1999 IEEE, pp. 23–29.

Jerry M. Soden, Charles F. Hawkins and Anthony C. Miller, *Identifying defects in deep–submicron CMOS ICS*, IEEE Spectrum, Sep. 1996, pp. 66–71.

Takeshi Sakata, Masashi Horiguchi and Kiyoo Itoh, *Sub–threshold–current reduction circuits for multi–gigabit DRAM's*, Central Research Laboratory, Hitachi, Ltd., pp. 45–46.

Takashi Inukai and Toshiro Hiramoto, *Suppression of Stand–By Tunnel Current in Ultra–Thin Gate Oxide MOS-FETs by Dual Oxide Thickness MTCMOS (DOT–MTC-MOS)*, Extended Abstract of 1999 International Conference of Solid State Devices and Materials, Tokyo, pp. 264–265.

Katsuhiro Seta, Hiroyuki Hara, Tadahiro Kuroda, Mazakazu Kakumu, Takayasu Sakurai, *50 Active–Power Saving without Speed Degradation using Standby Power Reduction (SPR) Circuit*, 1995 IEEE International Solid State Circuits Conference, pp. 318–319.

Maurice J. Bach, *The Design of the Unix Operating System*, Prentice Hall, Inc., 1986 by Bell Telephone Laboratories, pp. 210–263.

* cited by examiner

*Primary Examiner*—Jeffrey Zweizig

(57) ABSTRACT

A semiconductor integrated circuit device for fast and low power operations, comprising a plurality of circuit blocks of a chip, each of which has a plurality of states with different power consumption values. A power management circuit determines the state of each of the circuit blocks so as not to exceed a maximum power consumption value of the semiconductor integrated circuit device by considering the power consumption of each circuit block and by each state transition in each circuit block. The maximum power consumption value may be preset or adjustable after fabrication.

16 Claims, 13 Drawing Sheets

FIG.3

|  | ACT | STB | SLP |
|---|---|---|---|
| CKT1 (CPU) | 50mW | 20mW | 0mW |
| CKT2 (FPU) | 100mW | 50mW | 0mW |
| CKT3 (DSP) | 30mW | 10mW | 0mW |
| CKT4 (RF) | 150mW | 0mW | 0mW |

FIG.5

| TIME | CKT1 (CPU) | CKT2 (FPU) | CKT3 (DSP) | CKT4 (RF) | PWR |
|------|------------|------------|------------|-----------|-------|
| 0    |            | STB        |            |           | 100mW |
|      |            |            | SLP        |           |       |
| 1    | ACT        | ACT        |            |           | 150mW |
| 2    |            |            | STB        | STB       | 60mW  |
| 3    |            |            |            |           | 30mW  |
|      | SLP        | SLP        |            |           |       |
| 4    |            |            | ACT        |           | 30mW  |
| 5    | STB        |            |            | ACT       | 200mW |
| 6    | ACT        | STB        | STB        | STB       | 110mW |

FIG.7

| TIME | CKT1 (CPU) | CKT2 (FPU) | CKT3 (DSP) | CKT4 (RF) | PWR |
|---|---|---|---|---|---|
| 0 |  | STB | SLP |  | 100mW |
| 1 | ACT | ACT |  |  | 150mW |
| 2 |  |  | STB |  | 60mW |
| 3 |  |  |  | STB | 30mW |
| 4 | SLP | SLP | ACT |  | 30mW |
| 5 | STB |  |  |  | 50mW |
| 6 | SLP | SLP | SLP | ACT | 150mW |

SEMICONDUCTOR INTEGRATED CIRCUIT DEVICE

PRIORITY TO FOREIGN APPLICATIONS

This application claims priority to Japanese Patent Application No. P2000-185908 and P2001-119032.

BACKGROUND OF THE INVENTION

1. Field of the Invention

The present invention relates to a semiconductor integrated circuit device, and, more particularly the present invention relates to a semiconductor integrated circuit device for use in fast and low power operation properties.

2. Description of the Background

As described in "Design Challengers of Technology Scaling" IEEE MICRO vol. 19, No.4, pp23–29, 1999 ("document 1"), the power consumption of microprocessors and other such chips is increasing year after year. In the year 2000, some chips appeared on the market with a power consumption exceeding 100 W.

As described in document 1, the power consumption caused by a leakage current also increases exponentially as the fabrication process produces smaller circuits. In particular, an increase in the subthreshold leakage current has been noted. In addition to the subthreshold leakage current, junction leakage currents such as the gate channeling current and the GIDL (Gate-Induced Drain Leakage) current increase as the fabrication process produces smaller circuits as described in "Identifying defects in deep-submicron CMOS ICs" IEEE Spectrum pp-66–71, September, 1996 ("document 2").

As described in document 1, power consumption Pac caused by charging/discharging of a load among the power consumption types in the active state of the above chip is proportional to the result of (operation frequency f)×(load capacity C)×(supply voltage V)×(supply voltage V) Typically, therefore, a low voltage has been used as a supply voltage (hereafter, "conventional example 1").

In order to reduce power consumption Ps1 caused by the sub-threshold leakage current in the standby state of the subject circuit, "Subthreshold-Current Reduction Circuits for Multi-Gigabit DRAMs", Symposium on VLSI Circuits Digest of Technical Papers, pp45–46, May 1993 ("document 3") proposes a power switch method. According to the method, a power switch is disposed between a power line and a circuit, and the power switch is turned off when the circuit stands by (hereafter, "conventional example 2").

In addition, "50% Active-Power Saving without Speed Degradation using Standby Power Reduction (SPR) Circuit", ISSCC Digest of Technical Papers, pp318–319, 1995" ("document 4") proposes a substrate bias control method. According to the method, the voltage of a substrate terminal of a MOS transistor of the subject circuit is switched between active and standby states and the threshold voltage of the MOS transistor is switched between active and standby states, thereby reducing the subthreshold leakage current in the standby state (hereafter, "conventional example 3").

Furthermore, "Suppression of Stand-by Tunnel Current in Ultra-Thin Gate Oxide MOSFETs by Dual Oxide Thickness MTCMOS (DOT-MTCMOS)", Extended Abstract of the 1999 International Conference on Solid State Devices and Materials, pp.264–265, 1999 ("document 5") describes a method for reducing power consumption pg1 caused by the gate tunneling current in the standby state. According to the method, a thick oxide PMOS transistor is disposed between a circuit configured by a thin oxide MOS transistor and a power line, and the power switch is thereafter turned off while the circuit stands by, thereby reducing the power consumption caused by the gate tunneling current in the standby state (hereafter, "conventional example 4").

Alternatively, a method for managing chip level power consumption is disclosed in the official gazette of JP-A-152945/1996. According to this method, each function block requests a power management apparatus for a necessary power according to the load state, and the power management apparatus calculates the total power consumption requested from the function blocks. When the total requested power is within the maximum supply power available, the power management apparatus allows the requested power to be sent to the functional blocks. When the total power exceeds the maximum supply power, the power management apparatus controls the clock frequency and the supply voltage of each function block so that the total requested power does not exceed the maximum supply power.

However, this disclosed method gives no consideration to the current in the standby state, which is increasing as described above. Because the power management apparatus cannot disable the operation of each function block, the integration of a circuit according to any of the methods in the conventional examples has been limited. In addition, where the power management apparatus controls the clock frequency and the supply voltage of each function block, the power consumption required for controlling the apparatus itself is not taken into account. Thus, the power of a chip to be controlled by the conventional methods has been limited.

Along with an increase in the number of functions required for microprocessors or other such chips, the number of MOS transistors integrated on these chips, as well as their operational frequency, also is increasing. Consequently, power consumption Pac caused by the charging/discharging of the circuit load also increases. The method of conventional example 1, when reducing this power consumption Pac, cannot completely address the incremental trend of the power consumption Pac because to keep or improve the operational speed of a chip in the state of lowered supply voltage, where the Pac generally can be reduced, requires lower-setting of a threshold voltage for each MOS transistor of the chip or reducing the gate oxide thickness of the MOS transistor, causing both Ps1 and Pg1 to be increased exponentially. In spite of these problems, the method of conventional example 1 has typically been considered the most effective for reducing the Pac value. The method has thus been used widely as described in document 1.

Both Ps1 and Pg1 have also increased year after year as described in documents 1 and 2. Although the methods of conventional examples 2 through 4 are proposed to suppress an increase of Ps1 and Pg1, those methods can reduce neither the Ps1 nor the Pg1 while the chip is active. These methods can only reduce Ps1 and Pg1 while the chips stands by. The methods in conventional examples 2 through 4 are effective only when the power consumption values (Ps1 and Pg1) caused by the subthreshold leakage current and a gate channeling current can be ignored with respect to the Pac value, since reduction of the Ps1 and the Pg1 is only required in the standby state in which the Pac becomes almost zero. Where both Ps1 and Pg1 are too large to be ignored with respect to the Pac value, however, the Ps1 and the Pg1 may significantly affect the power consumption of the chip in the active state. None of the methods in the conventional examples 2 through 4 is therefore effective in reducing the power consumption.

SUMMARY OF THE INVENTION

The present invention, therefore, preferably provides a power control circuit that can manage and control both the active and standby modes of each circuit block of a chip. Because the power controlling of each circuit block by the power control circuit is accomplished prior to the whole operation of the subject semiconductor integrated circuit, the power consumption of the semiconductor integrated circuit can be controlled properly. (In this point, the technique is different from th e prior art disclosed in said JP-A-152945/996, in which an amount of power to be supplied to each circuit block is controlled according to the whole operation of a semiconductor integrated circuit.)

One preferred configuration of semiconductor integrated circuit according to the present invention includes a plurality of circuit blocks and a power control circuit, wherein each of these circuit blocks has a plurality of states, for example a first and a second state. Each circuit block works in accordance with its function in the first state and rests in the second state. The power control circuit preferably determines the state of each of those circuit blocks so as not to exceed the maximum power consumption of the semiconductor integrated circuit.

In accordance with at least one embodiment of the present invention, the power control circuit gives consideration not only to the power consumption of each circuit block in each of a plurality of states, but also to the power consumption by each state transition so as to decide the state of each circuit block. At this time, the clock frequency supplied to each circuit block and the leakage current of the circuit block are controlled so as to vary the power consumption of each circuit block.

This power control circuit enables its functions to be described by a language such as the HDL (Hardware Description Language) and may be supplied as electronic data distributed through a medium (e.g., an optical recording medium such as a CD-ROM or a magnetic recording medium such as a floppy disk) or through the Internet or an intranet. Use of this circuit block electronic data permits a semiconductor integrated circuit to be advantageously designed under design properties of the past or of third parties.

Where the specifications of an interface between a power control circuit for controlling the power of each circuit block, as well as the specifications of an interface between a power control module for controlling the power of each circuit block in the power control circuit and a power arbiter ARBIT for adjusting the power consumption among the subcircuits are decided beforehand, the designer may be able to design a semiconductor integrated circuit more easily according to the present invention.

Additional objects, features and advantages of the invention will appear more fully from the following detailed description, drawings and attached claims.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 3 is an embodiment of a power table for states of subcircuits when the power control method of the present invention is employed;

FIG. 5 is an embodiment of subcircuit scheduling;

FIG. 7 is an embodiment of subcircuit scheduling;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a detailed description will be provided hereinbelow with reference to the attached drawings.

<First Exemplary Embodiment>

Figure 1:
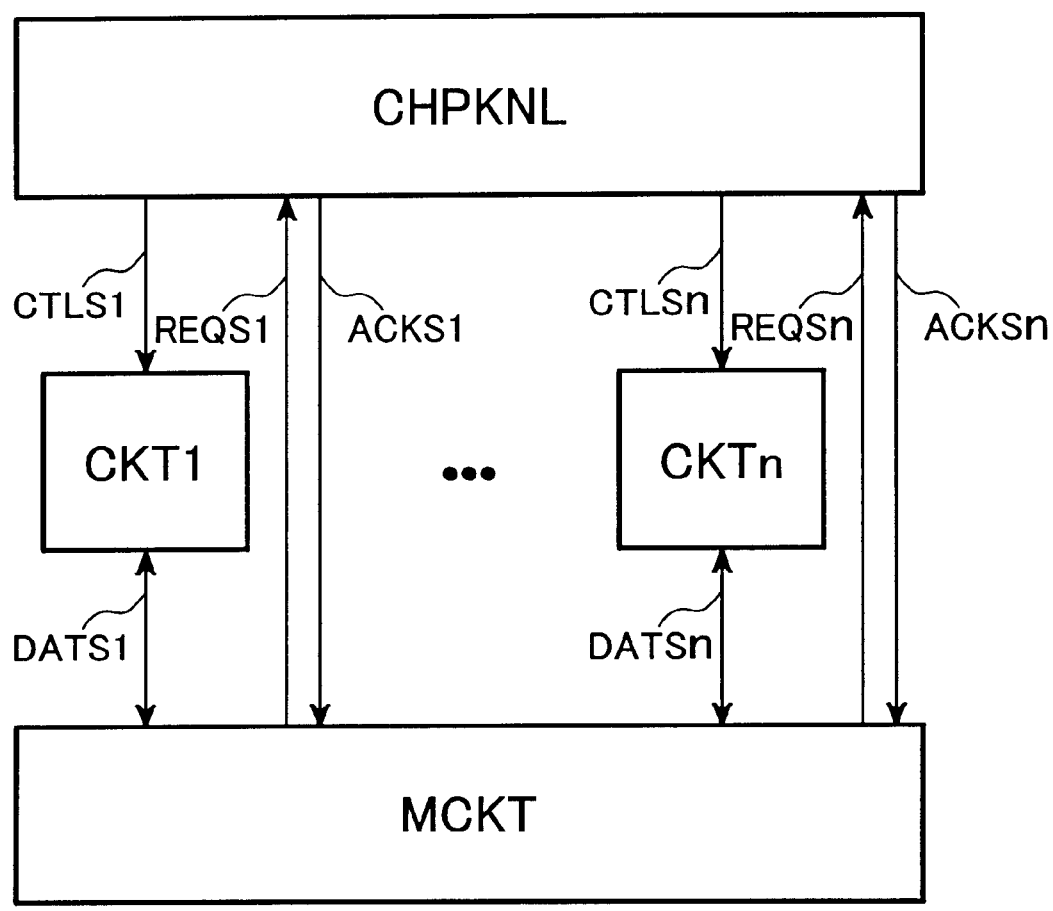
FIG. 1 is an embodiment of a chip of the present invention.

FIG. 1 shows one presently preferred embodiment of a chip CHP1 that employs the power control method of the present invention. In FIG. 1, CKT1 to CKTn denote subcircuits. MCKT denotes a main circuit and CHPKNL denotes a chip power manager (hereafter, "chip kernel"). DATS1 to DATSn denote data signals (data lines) and CTLS1 to CTLSn denote power control signals (power control lines). REQS1 to REQSn are request signals (request lines) and ACKS1 to ACKSn denote acknowledge signals (acknowledge lines). (Note: the same symbols are used for both signals and lines for sending the signals.)

The main circuit MCKT accesses the subcircuits (CKT1 to CKTn) in accordance with the following method to send/receive data via data lines DATS1 to DATSn, executing the functions that chip CHP1 is requested to perform. The main circuit MCKT is a circuit which is not power-controlled and is privileged to access each of the subcircuits CKT1 to CKTn. When the chip CHP1 is powered, the main circuit MCKT is activated, and the subcircuits CKT1 to CKTn are activated as follows. Below, a description is made detailing how the main circuit MCKT activates the subcircuit CKT1.

The main circuit MCKT is active and the subcircuits CKT1 to CKTn stand by so as to minimize their power consumption just after the chip CHP1 is powered. The standby state includes several different states such as the STB and SLP states which are described with reference to FIG. 2 below.

Certain methods executed as follows may be used alone or in combination to reduce power consumption. Some of these methods may include: (1) No clock is supplied to the subcircuits CKT1 to CKTn; (2) No supply voltage is supplied; and (3) The leakage current is suppressed. These methods can be combined according to the subject property as long as the chip power consumption is controlled within the maximum. For example, in the case where the supply voltage is supplied to the subcircuits CKT1 to CKTn while the supply of the clock is stopped, each of the subcircuits CKT1 to CKTn may be reactivated quickly by supplying the clock to it. Alternatively, when the methods (2) and (3) are combined, the static power consumption may be reduced more than when only the method (1) is used. The chip CHP1 can thus achieve power saving. When the subcircuits CKT1 to CKTn stand by, the power control method can be varied among them; for example, only the clock supply may be stopped or both of the clock supply and the power-supply voltage supply may be stopped for each subcircuit separately.

When the main circuit MCKT intends to access the subcircuit CKT1, the main circuit MCKT issues a request signal REQ1 to the chip kernel CHPKNL so as to request access to the subcircuit CKT1. The chip kernel CHPKNL returns an acknowledge signal ACKS1 to the main circuit MCKT to enable the access, and the state of the subcircuit CKT1, when receiving a power control signal CTLS1, makes a transition from standby to a state in which a normal operation of the subcircuit is enabled. The main circuit MCKT thus accesses the subcircuit CKT1 to send/receive data via the data line DATS1. The main circuit MCKT can continue to access the subcircuit CKT1 as long as the ACKS1 is valid. When the ACK1 is invalidated, the main circuit MCKT is preferably no longer able to access the subcircuit CKT1.

The chip kernel CHPKNL disables the main circuit MCKT from accessing (refuses access to) any subcircuit in the case where the preset maximum chip power Pmax is exceeded. At this time, upon receiving a request for accessing a subcircuit from the main circuit MCKT, the chip kernel CHPKNL controls the state of each subcircuit to lower the power consumption under the Pmax value through the power control lines CTLS1 to CTLSn, thereby enabling the main circuit MCKT to access the subject subcircuit. The chip kernel CHPKNL then issues an acknowledge signal (ACKS1 to ACKSn) to the main circuit MCKT, so that the main circuit MCKT can access one of the subcircuits CKT1 to CKTn.

When the chip kernel rejects the request signal REQ1, the chip kernel CHPKNL communicates the rejection to the main circuit MCKT by ceasing to the issue the acknowledge signal ACKS or by other means. The main circuit MCKT may then decide whether to delay the access of the subcircuit or cease accessing another subcircuit so as to access the first subcircuit. The chip kernel CHPKNL can also increase the margin of the power consumption of a standby subcircuit by reducing the leakage current of the subcircuit.

A description is now made for an embodiment of a power control method (for generating a plurality of states—including standby states—with different power consumption values) employed for subcircuits CKT1 to CKTn with use of power control signals CTLS1 to CTLSn. Thereafter, a description is made for a state control method (hereafter, "subcircuit scheduling") for controlling the state of each subcircuit so as to lower the chip power consumption under the preset maximum chip power Pmax, thereby enabling the main circuit MCKT to access a requested subcircuit.

Figure 2:
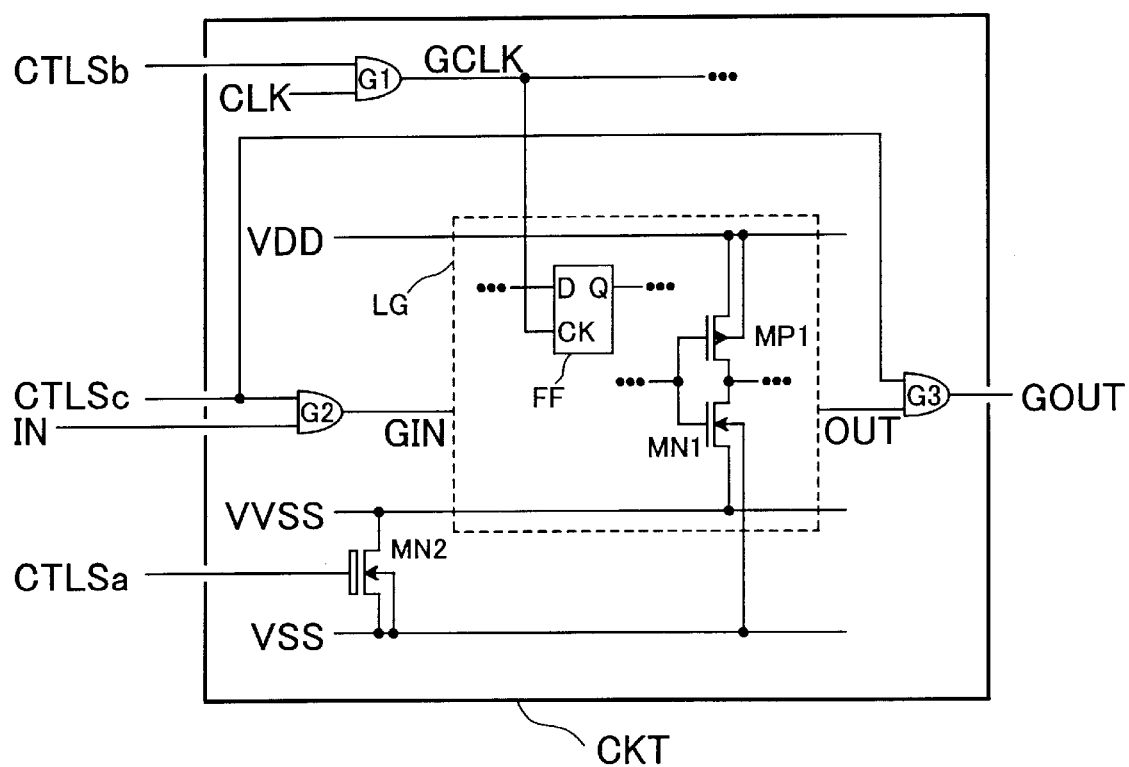
FIG. 2 is an embodiment of a power control method of the present invention.

FIG. 2 shows an embodiment of the power control method employed for subcircuits CKT1 to CKTn. G through G3 denote AND gates, MP1 denotes a PMOS transistor, MN1 denotes an NMOS transistor, and MN2 denotes an NMOS transistor having a gate oxide tox2 thicker than the gate oxide tox1 of MN1 and a threshold voltage (absolute value) Vth2 higher than the threshold voltage (absolute value) Vth1 of the MN1. VDD and VSS denote a positive side power line and a negative (ground) side power line respectively.

The thickness of a gate dielectric film is decided not only by a physical length, but also by an electrical length. Consequently, MN1 and MN2 may be made of the same dielectric film material while the physical dielectric film thickness is varied between them, or MN1 and MN2 may be equal in physical dielectric film thickness while the dielectric constant is varied between the dielectric film materials used for them, or both dielectric film material and physical film thickness may be varied between MN1 and MN2.

In FIG. 2, LG denotes a circuit for enabling the function of each subcircuit to be executed. In this embodiment, LG includes an inverter configured by a flip-flop FF, a PMOS transistor MP1, and an NMOS transistor MN1. The NMOS transistor MN2 is connected between the circuit LG and the negative side (ground) power line. The line connected to the drain of the NMOS transistor is used as a virtual ground line VVSS and a negative side (ground) power line of the circuit LG.

The power control signal (power control line) consists of CTLSa to CTLSc. When the first power control signal CTLSa is 'H', the NMOS transistor MN2 is on, and the circuit LG is thereby powered. When the first power control signal CTLSa is 'L', the NMOS transistor MN2 is off, and the power supply to the circuit LG is thereby stopped. When the second power control signal CTLb is 'H', a clock signal CLK is sent to the GCLK via the AND gate G1, and a clock is thereby distributed into the circuit LG. When the second power control signal CTLSb is 'L', the output GCLK of the AND gate G1 becomes 'L', and the clock distribution into the circuit LG is stopped.

Hereinafter, the state of (CTLSa, CTLSb)=('H', 'H') will be referred to as the ACT state, the state of (CTLSa, CTLSb)=('H', 'L') will be referred to as the STB state, and the state of (CTLSa, CTLSb)=('L', 'L') will be referred to as the SLP state respectively.

In the ACT state, the circuit LG is powered. The chip CHP1, therefore, consumes the power due to the subthreshold leakage current, the gate tunneling current, and others. In addition, because a clock is distributed to the subcircuits, the chip CHP1 consumes the power due to discharging of the load. On the other hand, in the STB state, because the circuit LG is powered, the chip CHP1 consumes the power due to a subthreshold leakage current, a gate tunneling current, and others. However, because no clock is distributed to the subcircuits in the STB state, the chip CHP1 does not consume any power which is otherwise consumed by discharging of the load. In the SLP state, because the circuit LG is not powered, the chip CHP1 does not consume any power which is otherwise consumed by a subthreshold leakage current, a gate tunneling current, and others. Because the MN2 has a high threshold voltage vth2 and a thick gate oxide tox2, no large gate tunneling current flows in the NMOS transistor MN2 that is off and no sub-threshold leakage current flows in the circuit LG via the NMOS transistor MN2. Naturally, because no clock is distributed to the circuit LG, the chip CHP1 does not consume any power which is otherwise consumed by discharging of the load.

The third power control signal (line) CTLSc is connected to the AND gates G2 and G3 to which the input signal IN and the output signal OUT of the circuit LG are connected respectively. When the CTLSc is 'H', the signal IN entered from outside a subcircuit CKT is sent to the circuit LG via the AND gate G2 as a signal GIN. Also the output signal OUT from the circuit LG is output to the outside of the subcircuit CKT via the AND gate G3 as an output signal GOUT. On the other hand, when the third power control signal CTLSc is 'L', the outputs from the AND gates G2 and G3 become 'L' respectively and the input signal IN from outside the subcircuit CKT is not sent to the circuit LG. Therefore, the output GOUT from the subcircuit CKT remains 'L' regardless of the voltage value of the output signal OUT from the circuit LG.

Controlling the sending of the input signal by the AND gate G2 as described above can thus prevent the signal GIN from unnecessary state transition. For example, in the case where the third power control signal CTLSc is driven to 'L' while the circuit LG is in an inactive state, such as the STB or SLP state in which no clock is distributed into the circuit LG, the power consumption by unnecessary state transition may be decreased. The output signal from the AND gate G3 can be fixed so as to prevent an unstable voltage from being generated. For example, the voltage of the signal GOUT does not become 'H' nor 'L' in the SLP state in which the circuit LG is not powered. It is also possible to prevent a short circuit current or other similar problem from occurring in the circuit that follows the circuit LG and that accepts the signal GOUT. Consequently, although not specifically limited thereto, the third power control signal CTLSc may be driven to 'L' in the STB or SLP state so as to avoid the above problems effectively. In this case, the second and third power control signals CTLSb and CTLSc may be electrically tied together.

Where the high threshold and thick gate oxide NMOS transistor MN2 is used as a power switch as shown in FIG. 2, the power switch will preferably have one or more of the following effects that are more pronounced than when a PMOS transistor is used as a power switch as described in the document 5.

(1) When the power switch is on, the on-resistance must be lowered so as to reduce the impedance of the power supply. The NMOS transistor can obtain a smaller on-resistance than that of the PMOS transistor when the gate width is the same between them.

(2) A voltage higher than the VDDH can be applied to the gate of the NMOS transistor MN2 in the case where the NMOS transistor MN2 is on even when the VDD is low. The NMOS transistor on-resistance can thus be reduced. In particular, when the NMOS transistor NM2 is configured by a high voltage tolerance MOS transistor, like a thick gate oxide MOS transistor used for an interface circuit (I/O circuit) with external devices of the chip CHP1, the fabrication process can be simplified. In this case, the VDDH can be set to the same voltage as that of the I/O voltage (VDDQ), whereby the VDDH generation circuit may be omitted. However, differences caused by the irregularity of fabrication could be allowable under the description of "the same transistor."

FIG. 3 shows an example of the power consumption of each subcircuit when the power control method shown in FIG. 2 is employed. In this example, a microprocessor CPU, a floating point unit FPU, a signal processor DSP, and a communication circuit RF are used as subcircuits. According to the scale and the property of each circuit, the power consumption is varied as shown in FIG. 3 among the three states (ACT, STB, and SLP). As shown in FIG. 3, the power consumption in the ACT state is the largest, followed by that in the STB state. In the SLP state, the power supply is shut off, thereby a negligible amount of power is consumed.

Figure 4:
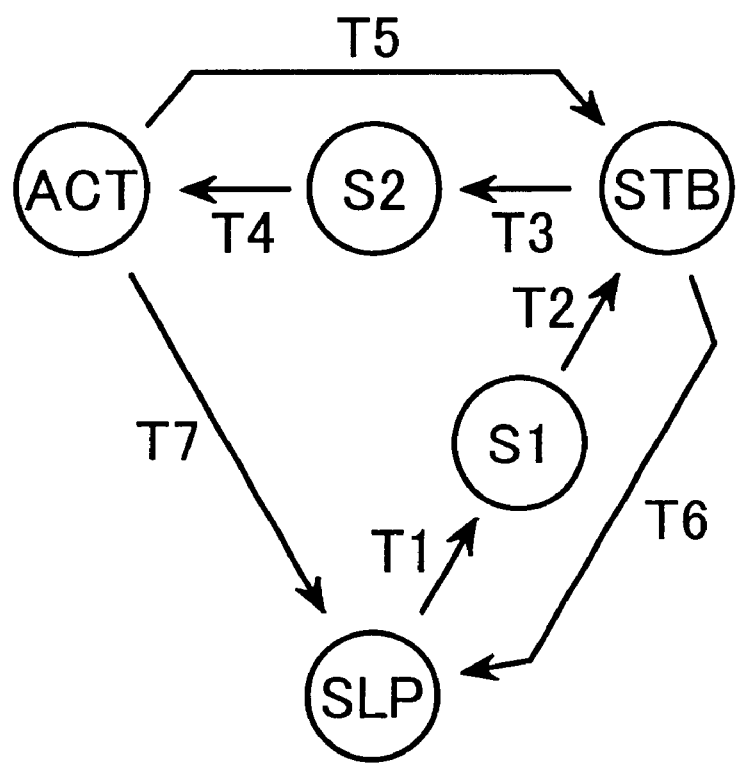
FIG. 4 is an embodiment of a state transition graph of the states of each subcircuit.

FIG. 4 shows an embodiment of a state transition diagram of the subcircuit CKT including the three states of ACT, STB, and SLP. An intermediate state preferably, occurs at a state transition from SLP to STB and at a state transition from STB to ACT as denoted by S1 and S2 in FIG. 4. With these intermediate states provided, each state transition may be executed stably.

For example, the circuit LG is powered in a state transition from SLP to STB. Although it depends on the scale of the circuit LG, when the circuit LG is powered, generally, a large rush current flows in the circuit LG. This rush current is classified into some types, including a current caused by charging of the load in the circuit LG and a short circuit current caused in the charging process. Generally, a large short circuit current flows in the CMOS circuit when the input node voltage is neither the positive nor the negative (ground) side power-supply voltage potentials. There exists a method for identifying this rush current wherein the power is turned on gradually. Consequently, the gate signal of the MOS transistor MN2 is changed in level from 'L' to 'H' at a small through-rate. The rush current, the power supply bump, and other effects can thus preferably be reduced, and the whole chip may be prevented from malfunctioning. This state transition is processed as a state S1. When a state transition is made to STB after completion of power supply to the circuit LG is detected (T2), the whole chip can be prevented from malfunctioning caused by an unstable power supply.

Where the gate signal of the NMOS transistor MN2 is changed in level from 'L' to 'H' at a slow rate, completion of power supply to the circuit LG can be detected by monitoring the MN2 gate signal potential. Consequently, the gate signal of the MOS transistor may only be required to be changed in level after the charging/discharging time of the node in the circuit LG. This is because charging of the node in the circuit LG is completed when the gate signal of the MOS transistor MN2 is changed in level to 'H' completely. In order to change the level of the gate signal of the MOS transistor MN2 after such time, it is only required that the gate of the MOS transistor is driven, for example, by a comparatively large output impedance driver. According to this method, the gate impedance of the MOS transistor MN2 increases. When it is expected that this high impedance line is affected adversely by such a noise as a cross talk, the gate of the MOS transistor MN2 may be driven again by a comparatively small output impedance driver when the completion of the power supply to the circuit LG is detected in the monitoring of the MN2 gate signal potential.

Figure 9:
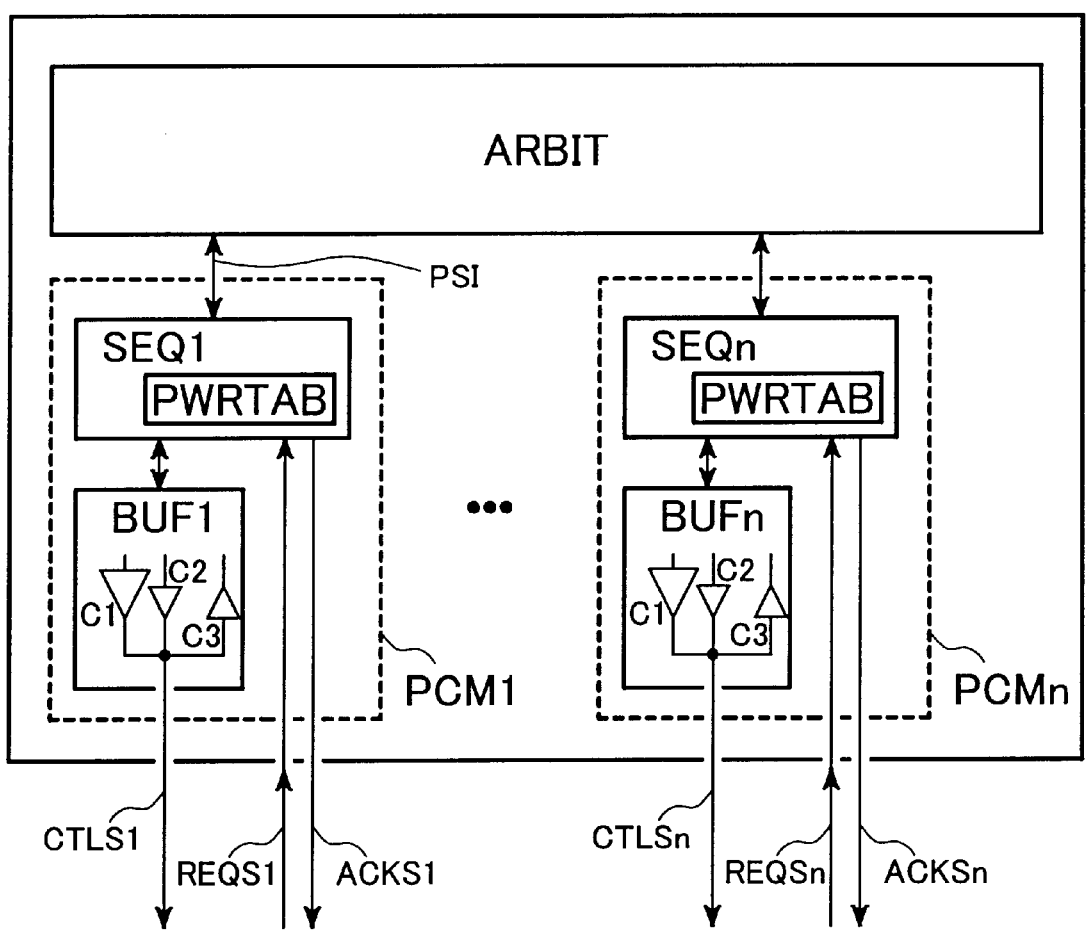
FIG. 9 is the details of a chip kernel CHPKNL shown in FIG. 1.

FIG. 9 shows an example of a configuration to be used for this process (described below). The drivers C1, C2, and C3 in the buffer BUF are circuits for executing the above driving method for the MOS transistor MN2. The driver C2 outputs a comparatively large impedance as described above. At first, the driver C2 is used to drive the MOS transistor MN2. The driver C1 outputs a comparatively small impedance and the circuit is used to monitor the MN2 gate signal potential.

The effect of the above state S1 is also obtained from the state transition from STB to ACT. For example, in the case where a predetermined time is needed to distribute a clock signal, an intermediate state S2 may be set in the state transition from STB to ACT so as to absorb the predetermined distribution time.

Although not shown in FIG. 2, a decoupling capacitor should preferably be connected between VDD and VSS. When the decoupling capacitor is connected between VDD and VVSS in this way, the noise removal performance of the subcircuit is improved compared to when the decoupling capacitor is connected between VDD and VSS. In this case, however, the decoupling capacitor is charged/discharged when the NMOS transistor MN2 is turned on/off, whereby the power is consumed unnecessarily.

The connection method shown in FIG. 2 is not always used specifically for the terminals to which the MOS transistor substrate terminals are connected. In addition, while the sub-threshold leakage current is controlled through the use of the power switching method that employs the NMOS transistor MN2 in FIG. 2, the control method is not limited only to that; a substrate bias control method as described in document 4 may also be used.

While it is assumed large circuit blocks such as a microprocessor CPU or a signal processor DSP are used as subcircuits LG in FIG. 3, the scale of each of those subcircuits is not specifically limited to these blocks. For example, one computing element and one memory circuit may be handled as a subcircuit respectively. A large-scale circuit is preferably divided into many small-scale circuits for detailed power controlling.

Also, while three states are assumed in FIG. 3, there may be only two states, such as SLP and ACT, or STB and ACT. There may also be four or more states. The number of states may be set for each subcircuit individually. For example, only two states may be set for some subcircuits, while more are used for others. The higher the number of states set, the more the power may be controlled in detail.

The state transition method is not limited specifically to that shown in FIG. 4. An optimal state transition method may also be employed for each chip or for each subcircuit.

FIG. 5 shows an exemplary embodiment of subcircuit scheduling. In order to simplify the description, the state transition of each of the subcircuits CKT1 to CKTn is done in accordance with the state transition method shown in FIG. 4 so that the total power consumption of all the subcircuits CKT1 to CKTn becomes 200 mW or less while the maximum power consumption Pmax of the chip is set to 250 mW. For example, the CKT1 is in the ACT state and both CKT2 and CKT4 are in the STB state at time 0. The total power consumption is 100 mW at this time. At time 1, a state transition is done to ACT in the CKT2 and the power consumption is increased to 150 mW. The state of each subcircuit is thus controlled so as to reduce the total power consumption under the Pmax.

As a specific method for subcircuit scheduling, there are many employable methods, for example, "UNIX Operating System Process Scheduling" as described in "UNIX Kernel Design" Computer Science Magazine BIT separate volume by Maurice J. Bach (translated by Aya Sakamoto), published by Kyoritsu Shuppan, p.211~230, October, 1990 ("document 6"), and "UNIX Operating System Memory Management" also in document 6, p.231~263. The UNIX operating system executes process scheduling in accordance with the scheduling rules preset for every process; swap-in and swap-out processings are executed for a plurality of processes on the basis of memory limitation and execution limitation. The memory limitation means an upper limit set for memory capacity and the execution limitation means limitation of the number of processes to be executed concurrently due to the limited number of CPUs. On the other hand, the chip of the present invention controls the power consumption of a plurality of subcircuits so as to execute the scheduling rules defined for every subcircuit on the basis of an idea that an upper limit is set for power consumption.

There are many methods for process scheduling and memory management executed under the control of the UNIX operating system and each of those methods can apply to the subcircuit scheduling of the present invention. The method to be employed in this embodiment is not limited specifically to any one such scheme. For example, it is possible to correspond a state in which the UNIX operating system executes a process existing in a memory (swap-in state) to the ACT state, a state in which the UNIX operating system stands by for execution of a process existing in a memory (swap-in state) to the STB state, and a state in which there is no process to be executed by the UNIX operating system in a memory (swap-out state) to the SLP state of the present invention respectively.

In addition to the UNIX operating system described above, there are many other operating systems such as MICROSOFT WINDOWS. The process scheduling methods and the memory management methods used in those operating systems can also be employed for the subcircuit scheduling of the present invention in the same way. In addition, there are many real time operating systems such as uITRON. Those real time operating systems are effective for special scheduling so as to assure the real time property. Those real time operating systems can also apply to the subcircuit scheduling of the present invention.

As described above, FIG. 5 shows an embodiment of subcircuit scheduling that suppresses the total power consumption of the subcircuits CKT to CKTn under 200 mW in order to simplify the description. The power consumption caused by power state transition is also ignored in the embodiment shown in FIG. 7. In the case of the subcircuit scheduling of the present invention, however, while the state of a subcircuit is controlled so as to suppress the chip power consumption under the preset maximum power consumption Pmax of the chip CHF1, the use of a requested subcircuit should be enabled. The power consumption by the state transition of each subcircuit should preferably be taken into consideration. In particular, when a state transition causes the power supply to be turned on/off, the power consumption by the state transition itself often becomes so large that it cannot be ignored. This is because the power-off operation results in discharging of many nodes in the subject circuit and the power-on operation results in charging of those nodes in the circuit.

One of the methods for suppressing the overhead that may occur due to the power consumption caused by many state transitions is to suppress the state transition frequency. For example, the power supply may be turned off when no subcircuit has been accessed for a certain time. In order to achieve the processing, it may only be necessary to provide the chip with a circuit for limiting the state transition frequency of each subcircuit in the chip kernel CHPKNL or in each subcircuit CKT. In order to achieve this, the information of the power consumption by the state transition in each subcircuit is preferably stored and managed in each subcircuit CKT or in the chip kernel CHPKNL.

For example, each subcircuit CKT or the chip kernel CHPKNL may be provided with an intermediate state (equivalent to the above power consumption information) in which the power consumption is reduced gradually (or kept at a fixed level) when the state of the subcircuit is changed from ACT to SLP or from STB to SLP while the chip is powered. The number of such intermediate states should preferably be set higher when the power consumption caused by the state transition due to power on/off and lower when the power consumption is small. For example, the intermediate states may be controlled as follows. When a subcircuit makes a state transition from ACT to STB after the end of an operation, it is set so that the subcircuit passes the five intermediate states (S1 to S5) sequentially before reaching the STB state, and the power supply to the subcircuit is turned off when the subcircuit makes a state transition from the intermediate state S5 to the STB state. The transition of those intermediate states is done at fixed cycles. In this case, when the state transition frequency is large, the subcircuit preferably makes a state transition to the ACT state before it goes into the STB state, that is, from an intermediate state (e.g., S3), thereby the large power consumption caused by the state transition can be prevented. It should be noted that when the power consumption by a state transition can be ignored, the circuit for limiting the state transition frequency may be omitted.

Because the state transition frequency is controlled in this way, the power consumption of the chip CHP1 including that caused by the state transition of each subcircuit CKT is suppressed under a predetermined value. The subcircuit scheduling should be controlled so as to minimize the power consumption of the chip CHP1, preferably under the Pmax value, while consideration is given to the subcircuit scheduling so as to not only suppress the power consumption of the chip CHP1 under the Pmax value, but also to improve the processing performance of the chip CHP1.

The method for limiting the power consumption of the chip CHP1 is not limited only to those embodiments specifically described above. Where there are 10 subcircuits (CKT1 to CKT10) in the chip CHP1, the subcircuit scheduling may be accomplished so as to suppress the total power consumption of the n ($1 \leq n \leq 10$) subcircuits among them under a certain value. The subcircuit scheduling may also be accomplished so as to suppress the total power consumption of the subcircuits CKT1 to CKT3 and the total power consumption of the subcircuits CKT4 to CKT10 under a certain value respectively. Any other methods (e.g., any other subcombination of circuits) for limiting the total power consumption may be employed as long as the value is suppressed within the Pmax.

Various embodiments of the chip power controlling method of the present invention can preferably obtain one or more of the following effects:

(1) Because the chip CHP1 of the present invention can be controlled to suppress the total power consumption thereof under the Pmax value regardless of the chip circuit scale, it is possible to suppress an increase of the power consumption Pac+Ps1+Pg1. When the power consumption Ps1 and/or others by a sub-threshold leakage current is large, the conventional package of the chip has been confronted with a risk of thermal runaway. In particular, when the chip performs an asynchronous operation, the risk of thermal runaway increases. This occurs because the chip's operational frequency increases due to a high heat. The present invention, however, may suppress the upper limit of power consumption, whereby it can prevent this thermal runaway.

(2) In the case of conventional chips, the maximum power consumption typically depends on the subject circuit scale and the operational frequency of the circuit. Therefore, the chip designer cannot know the maximum power consumption before beginning to design the circuit. For the chips of the present invention, however, the maximum power consumption of the subject chip can be decided by deciding the Pmax value before designing the chip, whereby the designing process can be simplified.

(3) Where it is difficult to limit the power consumption of a chip, it has been difficult conventionally to contract many designers who will design a subcircuit respectively so as to design one chip with use of subcircuits designed by those designers separately. This is because it is difficult to know the power consumption of each subcircuit beforehand. For the chip CHP1 of the present invention, however, because the specifications of the chip kernel to be accessed via request lines REQ1 to REQn, acknowledge lines ACK1 to ACKn, and power control lines CTLS1 to CTLSn are unveiled so that each subcircuit is designed according to the specifications, even a highly integrated semiconductor IC can be designed more easily.

(4) In the case of conventional chips, it has heretofore been difficult, if not impossible, to integrate many low threshold voltage MOS transistors and/or many thin gate oxide MOS transistors on one single chip due to the power limitation of the chip. For example, when 10 million MOS transistors, each with threshold voltage of 0.2V, are integrated on one chip, 100 mA or more might be reached by the sub-threshold leakage current alone. When the power limitation is 100 mA or so, therefore, it has been impossible to integrate this many low threshold MOS transistors on one chip. For the chip of the present invention, however, the power consumption including the chip's leakage current is controlled in accordance with the Pmax value, so it is possible to integrate 10 million of the above-described MOS transistors with threshold voltages of 0.2V on one single chip (hereafter, "virtual integration"). However, when the Pmax value is small, it may be impossible to power on and use all of those MOS transistors concurrently; when they are not used concurrently, no problem will arise from using all of those MOS transistors. In particular, when the threshold voltage Vth1 of transistors that configure a subcircuit is 0.2V or less or when the gate oxide thickness tox1 is 4 nm or less, the sub-threshold leakage current and the gate tunneling current cannot be ignored. The chip of the present invention is effective in this case.

(5) Because virtual integration is enabled for the chip of the present invention as described above, it is possible to set the threshold voltage Vth1 of each MOS transistor used to execute the functions of the chip to a value lower than any of those of the conventional chips, as well as to set the gate oxide thickness tox1 to a value lower than any of those of the conventional chips. Consequently, the chip of the present invention may use many MOS transistors with higher performance characteristics (e.g., lower threshold voltage transistors) than any of the conventional chips, and the operational frequency of the chip can be set higher than any of the conventional ones. Because the present invention enables the chip kernel CHPKNL to limit the operation of each subcircuit to a certain level, the speed of the chip may be reduced. This problem can be solved, however, with use of higher performance MOS transistors than any of the conventional ones. The chip of the present invention can thus be expected to speed up the total performance of the chip in comparison to conventional chips.

<Second Embodiment>

Figure 6:
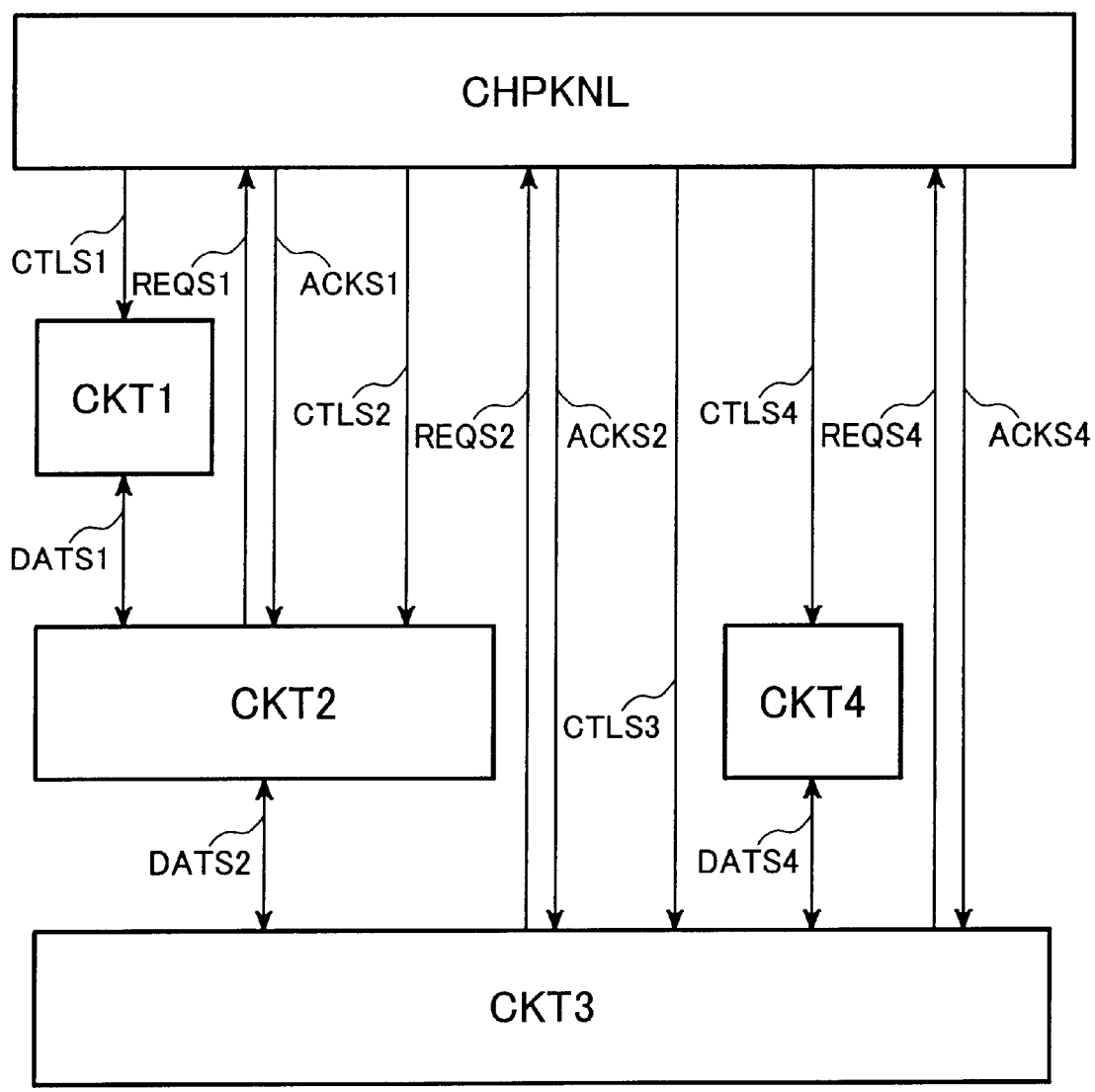
FIG. 6 is an embodiment of a chip of the present invention.

In the first embodiment shown in FIG. 1, the main circuit MCKT accesses the subcircuits CKT1 to CKTn under the control of the chip kernel CHPKNL. In this second embodiment, any circuit privileged to access each of the subcircuits CKT1 to CKTn can also be controlled for power consumption. FIG. 6 shows one example of this second embodiment.

CKT1 to CKT4 are subcircuits. The subcircuit CKT3 executes a function with use of the subcircuits CKT2 and CKT4. The subcircuit CKT3 executes a function with use of the subcircuits CKT2 and CKT4. The subcircuit CKT2 executes a function with use of the subcircuit CKT1. Therefore, the subcircuit CKT3 is privileged to access the subcircuits CKT2 and CKT4, and the subcircuit CKT2 is privileged to access subcircuit CKT1. Each subcircuit is privileged under the control of the chip kernel CHPKNL as in the first embodiment shown in FIG. 1.

This second embodiment is preferably characterized as follows. The second embodiment does not use the main circuit whose power consumption is controlled by the chip kernel CHPKNL as shown in FIG. 1. Without the main circuit MCKT, however, a problem arises; in the case where all the subcircuits are set in the SLP state shown in FIG. 3 when the chip is powered, the chip is not activated. This is because no circuit is activated (the chip cannot be activated forever). In order to avoid this problem, it is may just be required to preset a subcircuit (hereafter, a "boot circuit") that goes into the ACT state, for example, when the chip is powered. In the configuration shown in FIG. 6, the subcircuit CKT3 is preset as the boot circuit.

As shown in FIG. 6, there is none of request lines REQS and acknowledge lines ACKS provided for the boot circuit CKT3. After the chip is powered, the boot circuit CKT3 is activated by the power control signal CTLS3. Being activated, the boot circuit CKT3 is privileged to access the subcircuits CKT2 and CKT4. The boot circuit activates those subcircuits as needed, thereby executing predetermined functions. At this time, the boot circuit CKT3 must be privileged by the chip kernel CHPKNL so as to access those subcircuits via the request line REQS and the acknowledge line ACKS just like in the first embodiment. In the same way, the subcircuit CKT2 accesses the subcircuit CKT1.

Where a privileged circuit (e.g., the subcircuit CKT3) is defined as a host circuit and a circuit (e.g., the subcircuit CKT2 with respect to the subcircuit CKT3) accessed by the host circuit is defined as a slave circuit, then the boot circuit should be positioned at the highest level (that is, a subcircuit that has no subcircuits usable by itself) in the hierarchical order. In other words, the chip kernel CHPKNL cannot control any circuit that cannot be accessed by the boot circuit directly (e.g., CKT2) or indirectly (e.g., CKT1).

The configurations shown in FIGS. 1 and 6, as well as the configurations of the subcircuits CKT and the main circuit MCKT can be modified freely. For example, when the chip includes the main circuit MCKT in its configuration, the subcircuits CKT may be configured hierarchically as shown in FIG. 6. There is no need to make a host circuit correspond to its slave circuits at the one-to-one relationship; the correspondence may be one to many and many to one.

<Third Embodiment>

The physical and logical forms of the request lines REQS1 to REQSn, the acknowledge lines ACKS1 to ACKSn, the power control lines CTLS1 to CTLSn shown in FIGS. 1 and 6 are not specifically limited to those previously discussed embodiments. In the configuration shown as a physical form in FIG. 2, each of the control lines CTLS1 to CTLSn consists of three lines CTLSa, CTLSb, and CTLSc When power control signals are not transmitted in parallel as shown in FIG. 2, but are transmitted serially, only one power control line may be used for power controlling. Of course, in the case where the types of power controlling are limited, the number of lines can be reduced.

This same configuration holds true for the request lines REQS1 to REQSn. Where there is only one type of state transition (e.g., only ACT and STB are used), a single-bit request signal can be sent by one request line. Where there are more than three states and there are a plurality of states to be set as shown in the embodiment in FIG. 4, a plurality of lines may be used to send a request signal consisting of 2 or more bits for requesting a transition to each state. When a transition to each of those states is requested, priority should preferably be given to the transition. The state transition of the power of each subcircuit for subcircuit scheduling is thus controlled according to the priority. The chip kernel CHPKNL enables a higher priority request to access the target subcircuit, thereby improving the access efficiency of the subject resource.

The request lines REQS1 to REQSn, the acknowledge lines ACKS1 to ACKSn, and the power control lines CTLS1 to CTLSn may be bundled into a bus (hereafter, "power control bus") and connected to each subcircuit. Where there are many subcircuits, the wiring area of the lines can be reduced. In addition, the bus will make it easy to extend the chip. In such a case, the bus is preferably structured so as to avoid a conflict occurring among a plurality of accesses to the single bus. Because the request signal REQS is output from each subcircuit at a given timing, the common bus cannot be shared by the request lines REQS1 to REQSn. Where the round-robin method or the token ring method is employed, however, the request signal REQS may be delayed in reaching some subcircuits. The expandability of the chip, when in designing, will preferably more than make up for this deficiency. It is also possible to collect the acknowledge line ACKS and the power control line CTLS into a common bus while the request lines REQS may be connected to the subcircuits by the point-to-point method. In this case, the request signal from each circuit reaches the chip kernel fast and equally.

It is possible to use an on-chip bus provided in a conventional chip so as to transfer signals (e.g., Advanced Microcontroller Bus Architecture (SMBA) of ARM Corporation, Britain), as well as some or all of the signal lines may be used commonly as a power control bus.

<Fourth Embodiment>

The maximum chip power consumption Pmax may be determined when the subject chip is fabricated and/or designed so as never to be changed later. The Pmax may alternatively be changed after the chip is fabricated. In order to enable the Pmax to be changed later, the Pmax may be stored in a non-volatile memory integrated on the chip. The Pmax may also be read from an external source when the chip is powered. The Pmax may also be determined in accordance with the specifications of the wire bonding of the chip and/or by means of jumper switching with use of metal formed on the chip. There are also various other methods for deciding the Pmax, and those methods are not limited specifically to those methods disclosed here.

Where the maximum chip power Pmax is set so as to be changed after the chip is designed, the Pmax can be varied among packages even when the same circuits are integrated on their chips in those packages. Generally, in the case where a low-priced plastic package is used for the chip, the maximum allowable power consumption of the chip decreases. This is because the plastic package is large in thermal resistance and low in resistance to heat. In such a case, the Pmax value may be reduced to compensate for this. On the contrary, in the case where a high-priced ceramic package is used for the chip, the Pmax value can be increased. The higher the Pmax value is set, the more subcircuits that can be driven concurrently. The chip performance may thus be improved. When the Pmax is varied among packages, the chip performance can be set freely for each package.

Where the Pmax value is varied among package types in this way, circuit designing can be done commonly for both fast version chips and low power consumption version chips so as to lower the development cost and make it easier to provide many types of low cost chips.

FIG. 7 shows an embodiment of subcircuit scheduling that is different from that shown in FIG. 5. In the subcircuit scheduling shown in FIG. 7, the Pmax value is set lower than that shown in FIG. 5 and the total power consumption of the subcircuits is set to 150 mW. In FIG. 5, the total power consumption of the subcircuits at time 5 is 200 mW. In FIG. 7, however, the state transition from CKT1 and CKT4 to ACT is delayed respectively, whereby the total power consumption of the subcircuits is reduced to 150 mW or less. For example, in the case where the subcircuit scheduling shown in FIG. 5 is defined as subcircuit scheduling for fast version chips, that shown in FIG. 7 will become subcircuit scheduling for low power consumption version chips. In this way, the present invention can vary the Pmax value among specifications of chips that require a balance between processing performance and power consumption.

The possibility of Pmax value changes after the chip is designed means that the Pmax can be changed even after the chip is re-fabricated in a different fabrication process. The Pmax can be set optimally in each fabrication process.

Furthermore, the maximum power consumption Pmax of a chip may also be changed after the chip is powered. For example, the Pmax value may be changed according to the temperature of the chip. When the chip temperature rises, the Pmax value decreases. When the chip temperature drops, the Pmax value increases. Because there is a relationship between chip temperature and power consumption (Tj=Ta+ θxW, wherein Tj: junction temperature, Ta: peripheral temperature, θ: package thermal resistivity, W: power consumption) while the relationship includes a time lug, the present invention can manage chip temperatures.

Where a battery is used to drive the chip of the present invention, the Pmax value may be changed according to the residual level of the battery. When the residual level is still high or when the power to the chip is supplied from an AC outlet, the Pmax increases. When the residual level goes down, the Pmax decreases. When the power from the AC outlet is shut off, the Pmax may be reduced. Then, the battery driving time may be extended.

<Fifth Embodiment>

In order to take the power consumption of each subcircuit into consideration when in subcircuit scheduling, the chip kernel CHPKNL is required to know the power consumption in each state of each subcircuit as shown in FIG. 3. There are many methods for knowing the power consumption. The present invention enables any of those methods to be employed. For example, a table as shown in FIG. 3 may be stored in the chip kernel CHPKNL when the subject chip is designed. The power consumption in each state may be stored in each subcircuit so that the chip kernel CHPKNL reads the information therefrom according to a specific protocol, for example, when the chip is powered.

<Sixth Embodiment>

Subcircuit scheduling should be done by privileging the main circuit MCKT to access a target subcircuit via an acknowledge line ACKS as early as possible after the chip kernel CHPKNL receives the request via a request line REQS. This is to improve the processing performance of the chip. One of the methods for the subcircuit scheduling is to avoid state transitions that take much time in the subcircuit scheduling as often as possible. For example, in the state transition graph shown in FIG. 4, state transition to SLP should preferably be avoided in scheduling. This is because the state transition from SLP to ACT or STB causes a power-on operation and takes more time than the state transition from STB to ACT that does not cause any power-on operation. In order to realize the subcircuit scheduling, the number of intermediate states via which state transition from ACT (or STB) to SLP must be increased higher than the number of intermediate states via which state transition from ACT to STB is accomplished. For a method that does not use the SLP state, however, the power reduction effect decreases. This may present a problem.

The main circuit MCKT may request the chip kernel CHPKNL to make subcircuit scheduling for accessing a subcircuit before the actual access time, thereby reducing more power consumption. When receiving such a request, the chip kernel CHPKNL makes subcircuit scheduling for enabling the main circuit MCKT to access the target subcircuit as soon as possible upon acceptance of the next request for the actual access. This subcircuit scheduling preferably makes it possible to reduce the time required between receiving a scheduled access request and enabling the actual access, whereby the processing performance of the chip may be improved. For example, the main circuit MCKT requests a scheduled use of a subcircuit so as to execute the function and transfer the state of the subcircuit from SLP to STB in advance. When the main circuit MCKT reaches the actual access time, the main circuit MCKT makes a request to be privileged to access the subcircuit, whereby a state transition occurs from STB to ACT in the subcircuit. The main circuit MCKT can thus access the subcircuit more quickly after the actual access request is issued.

<Seventh Embodiment>

In FIG. 2, the NMOS transistor MN2 (power switch) is used to control the sub-threshold leakage current. The circuit configuration for reducing power consumption is not specifically limited to that shown in FIG. 2. A power supply circuit may be incorporated in the semiconductor integrated circuit device, whereby the supply voltage is changed. As described above, because the power consumption required when the CMOS circuit is active is proportional to the square of the supply voltage, the power of the circuit LG can be controlled with at least two states provided so as to be activated by a low supply voltage (e.g., 0.5V) and a high supply voltage (e.g., 1.2V).

In the embodiment shown in FIG. 2, when the MOS transistor MN2 is turned off, the information stored in such an information storage element such as a flip-flop in the circuit LG is erased. One of the methods that preferably prevents such a problem is to provide the subject semiconductor IC device with a level holder circuit that can retain the information even when the MOS transistor MN2 is turned off. For example, this level holder circuit works between a positive power line VDD and a negative (ground) power line VSS. It can be realized as a latching circuit configured by transistor driven by a comparatively low power. Where the semiconductor IC device is provided with at least two states to be activated by a low supply voltage and a high supply voltage, both being supply voltages of a subcircuit as described above, the supply voltage to be applied to the subject subcircuit with the low supply voltage is set so as to erase the information stored in the storage element (flip-flop) in the subcircuit (it is avoided to set a low supply voltage that fails in keeping the information here). In such a configuration, the level holder circuit described above may be omitted. Such a voltage can speed up the state transition to the high supply voltage state and the power consumption required for the state transition may be reduced.

In FIG. 2, the AND gate G1 is used to control (on/off) the clock sent to the circuit LG. In other words, the control method shown in FIG. 2 is accomplished by switching the clock between predetermined frequency clock oscillation and 0 frequency clock oscillation. On the other hand, the AND gate G1 may be replaced with means for changing the clock CLK frequency (e.g., a divider or a phase locked loop (PLL) circuit). As described above, because the power consumption, when the CMOS circuit is active, is proportional to the operational frequency, the power of the circuit LG can be controlled with at least two states to be activated by a low operational frequency (e.g., 10 MHz) and a high operational frequency (e.g., 200 MHz).

Figure 8:
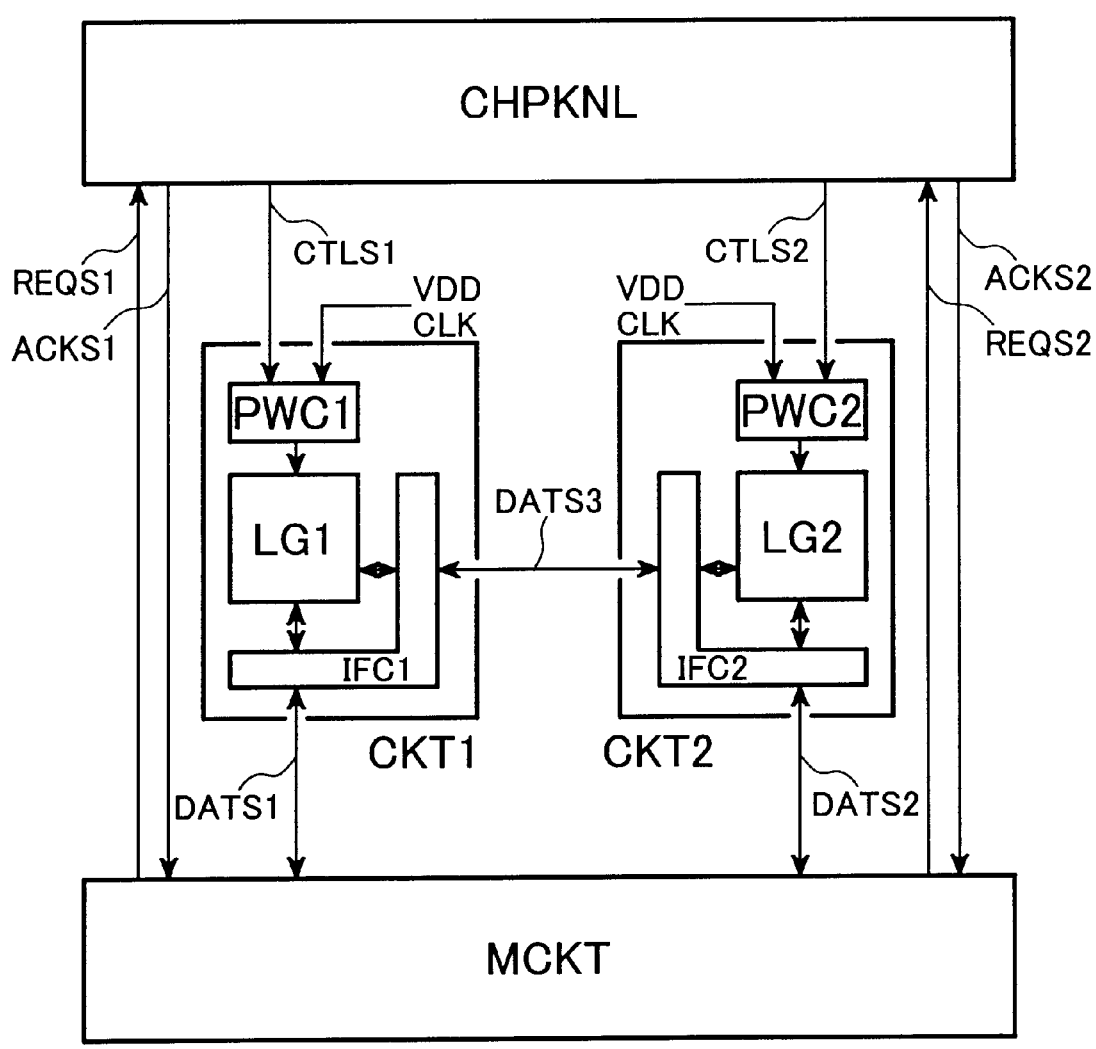
FIG. 8 is the details of the embodiment shown in FIG. 1.

FIG. 8 shows a configuration of a subcircuit enabled to realize such a variety of power control methods. While the FIG. 8 configuration is based on FIG. 1, the subcircuit configuration also parallels that shown in FIG. 6. The subcircuits CKT1/CKT2 are configured by power control circuits PWC1/PWC2, circuits LG1/LG2 for realizing the function of the subject subcircuit, and interface circuits IFC1/IFC2 used to communicate with an external device.

The power control circuit PWC controls the power consumption caused by charging/discharging of the load of the subcircuit and the power consumption caused by a leakage current according to the command received from the chip kernel CHPKNL via a power control line CTLS. Clock frequency variable circuits such as a power supply circuit or a PLL circuit are concrete configuration examples of the power control circuit PWS.

Where the supply voltage supplied to each circuit LG as described above is varied among the subcircuits so as to control the power consumption, it requires an interface circuit between those subcircuits or between each subcircuit and the main circuit MCKT. This is to prevent a leakage current such as a short circuit current to flow in CMOS circuits with different supply voltages when they are connected to the interface circuit. Use of an interface circuit IFC may prevent such a short circuit current. The official gazette of JP-A-195975/1999 discloses a configuration of a level converter circuit preferred for the interface circuit IFC to which subcircuits with different supply voltages are connected.

The correspondence between the configurations shown in FIGS. 2 and 8 is described below. The AND gates G2 and G3 are equivalent to the interface circuit IFC respectively and the NMOS transistor NM2 and the AND gate G1 are equivalent to the power control circuit PWC respectively.

<Ninth Embodiment>

FIG. 9 shows one presently preferred embodiment of a configuration of the chip kernel CHPKNL. Buffers BUF1 to BUFn are circuits for driving the power control lines CTLS. Sequencers SEQ1 to SEQn are used to make state transitions as shown in FIG. 4. The power table PWRTAB stores power values in various states as shown in FIG. 3, as well as power values (or energy values) required for state transitions. The drivers C1 to C3 of the buffers BUF1 to BUFn were described with respect to the first embodiment. Each of the power control modules PCM1 to PCMn is configured by a sequencer (SEQ1 to SEQn) and a buffer (BUF1 to BUFn). The power control module PCM controls each state of each subcircuit.

The power arbiter ARBIT controls the state of each subcircuit in accordance with the above subcircuit scheduling with reference to the value in the power table PWRTAB provided in each of the power control modules PCM1 to PCMn. Each of the power control modules PCM1 to PCMn controls the power of each of the subcircuits CKT1 to CKTn, while the power arbiter ARBIT adjusts the power consumption among the subcircuits CKT1 to CKTn. The processing required for the subcircuit scheduling can be dispersed among hierarchical layers, whereby each hierarchical layer can be designed more easily.

The circuit for limiting the state transition frequency of each subcircuit CKT can be realized by a power control module (one of PCM1 to PCMn). In another example, when a subcircuit CKT is not accessed for a certain time, the power control module PCM corresponding to the subcircuit changes the state of the subcircuit so as to reduce the power consumption independently of the power arbiter and communicates the new state and the power consumption to the power arbiter. Consequently, it is possible to realize subcircuit scheduling that can reduce the power consumption of the chip CHP1 effectively without applying an excessive processing load to the power arbiter ARBIT.

<Tenth Embodiment>

Figure 10:
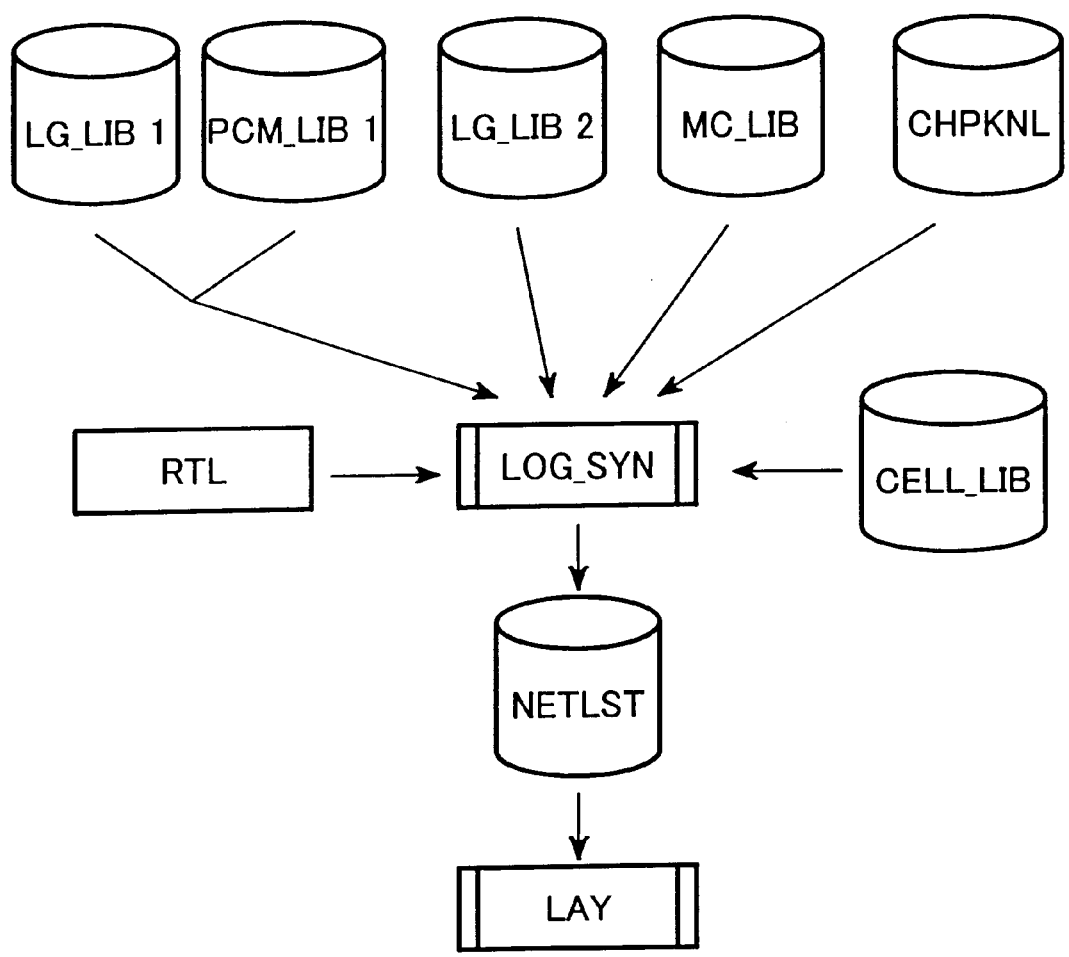
FIG. 10 is an embodiment of a design flowchart.

FIG. 10 shows a flowchart for designing a semiconductor device that realizes power controlling for the chip of the present invention. A library LG_LIB1 stores circuits for realizing the functions of subcircuits CKT. Each of the subcircuits CKT is not provided with a power control module PCM shown in the embodiment in FIG. 9. The library PCM_LIB1 stores the power control module PCM corresponding to each subcircuit CKT in the LG_LIB1. The library LG_LIB2 is also a library of subcircuits CKT, but each subcircuit CKT stored in the library LG_LIB2 is already provided with a power control module PCM. The library MC_LIB stores the main circuit MCKT shown in the first embodiment in FIG. 1.

The four libraries (LG_LIB1, PCM_LIB1, LG_LIB2, and MC_LIB) and the chip kernel CHPKNL are stored as data in which the function of each subcircuit is described by a language such as the HDL (Hardware Description Language) A logic synthesizing cell library CELL_LIB stores information (e.g., each cell type time delay information) of each cell type (e.g., cells of such logical gates or composite logical gates as AND, OR) used for synthesizing logics. The designer preferably creates the logical specification RTL (Register Transfer Level), RTL being one example and the invention not limited thereto, related to the whole chip and synthesizes the logics (LOG_SYN) of the net lists NETLST from the logical specifications RTL, as well as from the circuit data and the cell information stored in the library. The net list NETLST is then laid out (LAY).

The above-mentioned design flow makes it possible to apply the power control method of the present invention to any subcircuit (stored in the library LG_LIB1) when the power control module PCM is added to the subcircuit, although it may otherwise be difficult to apply the power control method to such a subcircuit with no modification. This makes it difficult to use many IPs (Intellectual Property: a circuit block used for a collection of computing functions, signal control functions, and other functions that is provided on an IC) supplied from "IP providers" on a chip to be designed, whereby the chip may be designed more efficiently.

The power control module PCM is preferably created for each subcircuit separately. Consequently, the PCM is designed on the basis of the specifications of the interface (hereafter, "Power Scheduling Interface" or "PSI") between a power arbiter ARBIT and a power control module PCM. The PSI includes a protocol used for commands from the power arbiter ARBIT and the returned protocol of the power control module in response to those commands.

In the same way, the designer who is to design the logical specifications RTL can understand the specifications of the interface between the power control module PCM and each subcircuit CKT and design each subcircuit controlled by the request signal REQS and the acknowledge signal ACKS (Hereafter, the interface is called "Power Managing Interface" or PMI"). The PMI includes a protocol used for the request signal from the main circuit MCKT or subcircuit block CKT and the acknowledge signal REQS from the chip kernel CHPKNL.

According to the interface specifications PMI and PSI, the power controlling of the present invention can be realized more easily with use of existing circuit block designs.

<Eleventh Embodiment>

Figure 11:
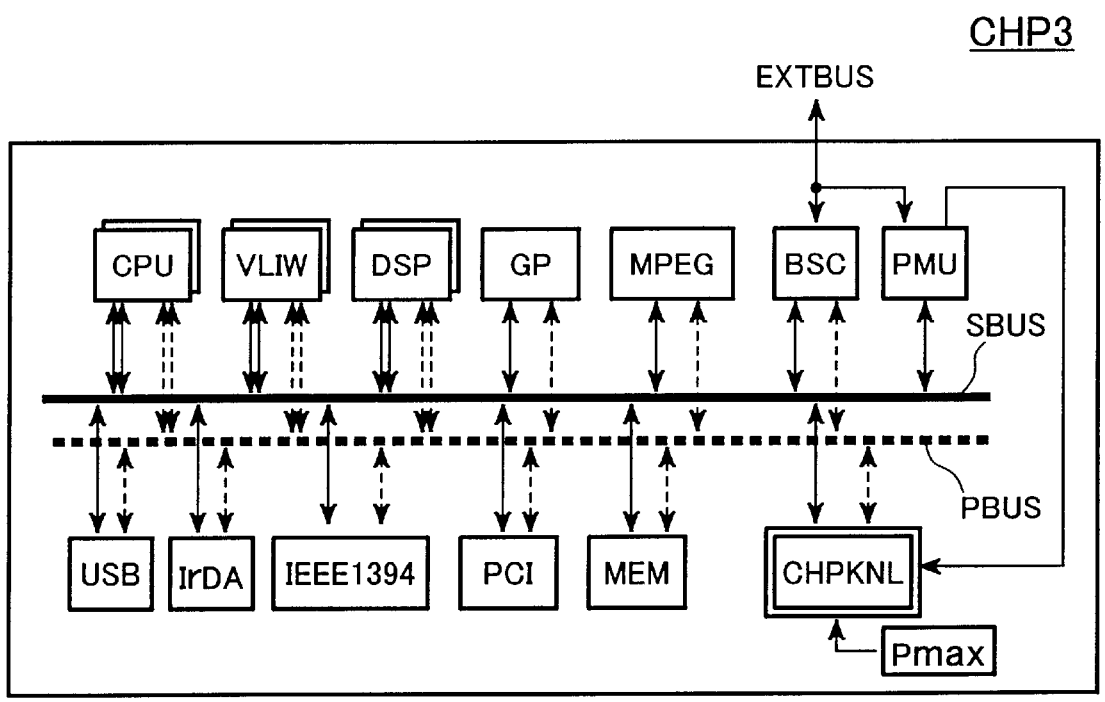
FIG. 11 is an embodiment of a chip that employs the power control method of the present invention.

FIG. 11 shows an embodiment of a chip (CHP3) for which the power control method of the present invention is employed. In FIG. 11, an on-chip bus SBUS in the chip (CHP3) is used to transfer signals. The SBUS is connected to a microprocessor (Central Processing Unit) CPU, a Long Instruction Word type microprocessor VLTW, a digital signal processor DSP, a graphic processor GP, an MPEG (Moving Picture Experts Group) signal processor circuit MPEG, a bus control circuit BSC, a chip power control circuit PMU, a USB (Universal Serial Bus) interface circuit USB, an. IrDA (Infrared Data Association) infrared beam communication interface circuit IrDA, an IEEE1394 interface circuit IEEE1394, a PCI (Peripheral Component Interconnect) interface circuit PCI, and a memory MEM. The EXTBUS is an external bus and is connected to the on-chip SBUS via the bus controller BSC. The CHP3 processes data with use of such dedicated circuits as CPU, VLIW, DSP, GP, MPEG, as well as the memory MEM so as to send/receive data to/from external devices with use of USB, IrDA, IEEE1394, PCI, and BSC. However, these particular listed circuit blocks are merely exemplary. They are selected and mounted appropriately for the desired functionality of chip CHP3. The power control bus PBUS is used for the power control method of the present invention.

The power of the chip CHP3 is preferably controlled as follows. The chip power control circuit PMU controls the power state of the whole CHIP3 according to instructions (e.g., interrupt) from outside the chip CHP3 (e.g., EXTBUS) or command strings (e.g., standby command) executed by the CPU and others. For example, the PMU controls the whole chip CHP3 so as to increase/decrease the operational speed or make the chip CHP3 stand by and rest (hereafter, each whole chip state is referred to as a "chip state"). The chip power control circuit PMU controls the chip kernel CHPKNL so as to set the chip CHP3 in various states as described above. Although the control of the chip kernel CHPKNL of the chip power control circuit PMU is not limited specifically, the chip kernel CHPKNL can also be controlled by changing the Pmax value of the chip kernel CHPKNL according to each chip state. This chip kernel CHPKNL is also used to control the power of every circuit module in accordance with the method of the present invention. The chip kernel CHPKNL may be an independent circuit block, as shown in FIG. 11, and it may be realized to have some functions of a circuit block (e.g., CPU).

Generally, the power consumption of a dedicated circuit is less than that of a general circuit. This is because, when compared with a general circuit, such a dedicated circuit has less redundant functional circuits. For example, power consumption, when a dedicated circuit is used for an MPEG processing, is less than when a general circuit is used for that. Because the chip CHP3 of the present invention is enabled for virtual integration as described above, many dedicated circuits can be integrated on the chip CHP3 just like in the embodiment shown in FIG. 11. Thus, the use of dedicated circuits, not general circuits, will make it possible to reduce the chip power consumption more significantly.

<Twelfth Embodiment>

The chip of the present invention may reduce the variation of the power consumption more than any of the conventional chips. None of the conventional chips gives consideration to the total power consumption of the chip for controlling the power of each subcircuit. This is why the peak power value (thermal design power) usually is several times greater than the average power. On the contrary, the chip of the present invention preferably enables its total power consumption to be limited within a preset maximum power consumption Pmax, whereby the use of any subcircuit that might exceed the Pmax value is delayed until a later time. The use of the subcircuit preferably is only enabled after a margin is generated in the power consumption of the chip, so that the Pmax value is not exceeded in accessing the subcircuit. Therefore, the power consumption of a conventional chip is reduced so as to increase the capacity of the power processing with the reduced power consumption. The maximum power consumption of the chip is lower than the peak power of the conventional chip, so that it can become closer to the average power value. Consequently, the time variation (di/dt) of the power consumption of the chip is eased. This time variation di/dt of the power consumption generates a voltage time variation dV/dt represented by Ldi/dt (L: power line inductance of the chip). The present invention can thus have an effect that the chip voltage variation can be suppressed lower than any of the conventional chips.

Figure 12:
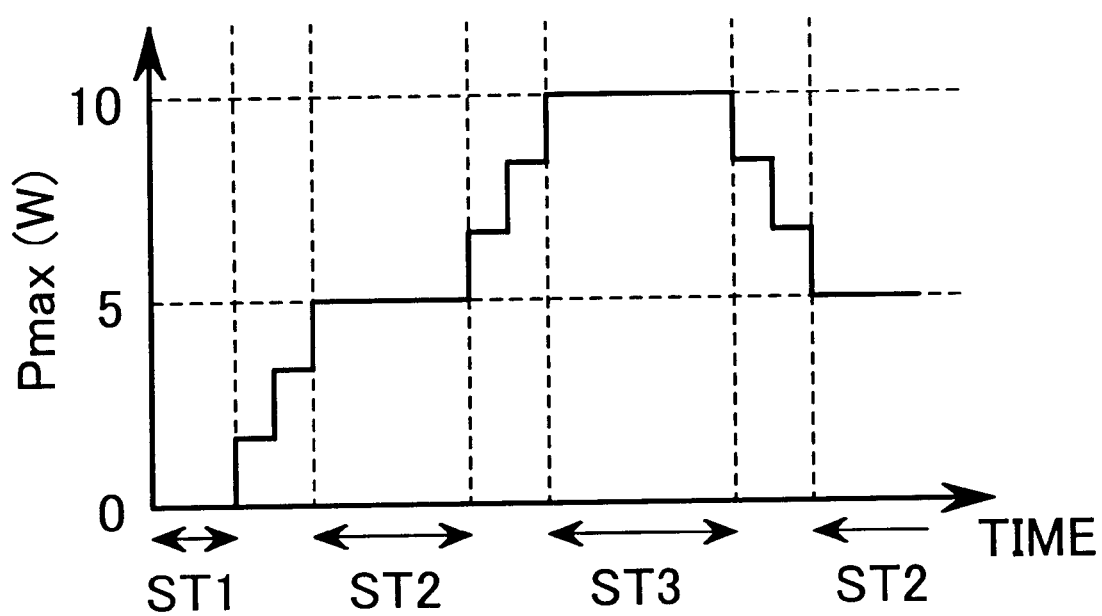
FIG. 12 is a graph showing chip state transition with step by step changes of the Pmax value.

As described above, the maximum power consumption of the chip can be changed in the fourth embodiment. In this embodiment, a description will be made for a method for changing the Pmax value so as to reduce the voltage variation (Ldi/dt). FIG. 12 shows an embodiment for controlling the maximum power Pmax in three steps according to, for example, the load of the chip.

The state 1 of the chip (ST1) means a state in which the chip is not powered or the subject circuit stands by or stops. For example, the state assumes Pmax=0. The state 2 of the chip (ST2) means a state in which the processing load of the chip is small, so that no problem arises from a processing delay even when the Pmax value is comparatively low. For example, the state assumes Pmax=5. The state 3 of the chip means a state in which the processing load of the chip is large, so that a higher Pmax value must be set so as to suppress a processing delay. For example, the state assumes Pmax=10. This embodiment enables the Pmax value to be changed step by step during each state transition of the chip. For example, in the case where k subcircuit blocks are activated at a time when the state is transferred from state 1 to state 2 in all the subcircuits at a time, the number of subcircuit blocks to be activated at a time can be suppressed lower than the k value when in the step-by-step controlling. As a result, the voltage variation to be caused by a current variation can be reduced.

<Thirteenth Embodiment>

Figure 13:
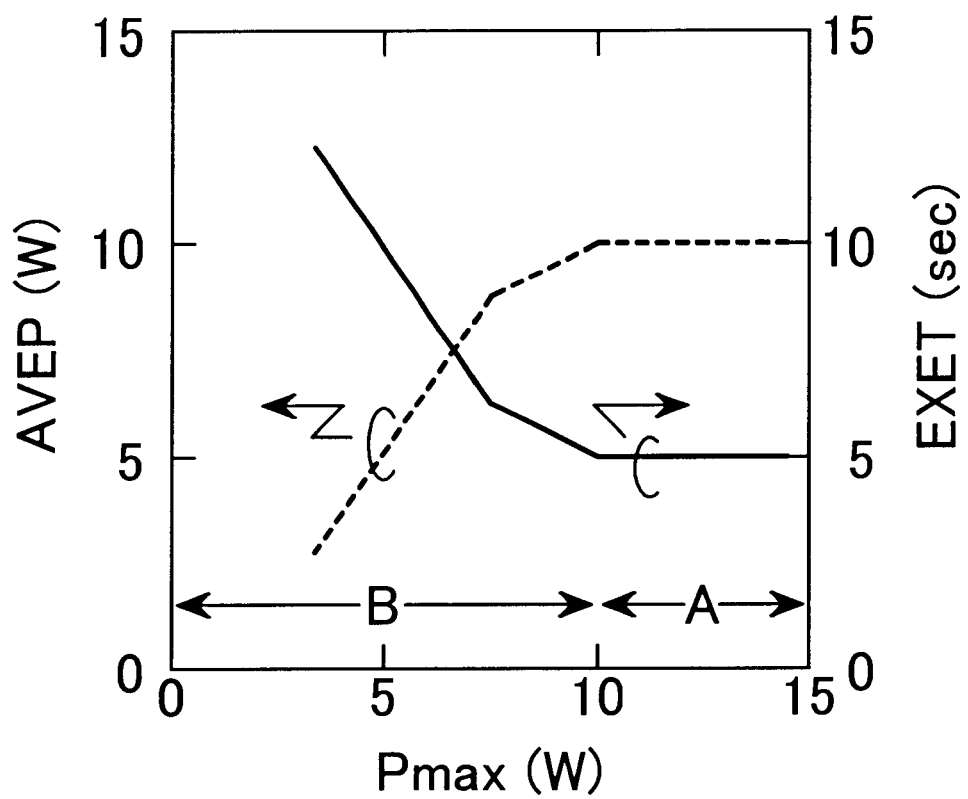
FIG. 13 is a graph showing the dependency of the average power consumption (AVEP) and the execution time (EXET) of the chip of the present invention on the Pmax value.

FIG. 13 shows an example of the dependency of the average power AVEP and the task execution time EXET on Pmax with respect to the chip of the present invention. The dotted line denotes the average power and the solid line denotes the execution time. Note that, however, no leakage current of the transistor is taken into consideration in this average power shown in FIG. 13. According to the level of dependency on the Pmax value, the graph is roughly divided into two areas (area A and area B). In area A, there appears almost no change in both average power AVEP and execution time EXET even when the Pmax is changed. On the other hand, as the Pmax value is reduced, the average power AVEP is reduced and the execution time EXET is increased in area B.

The state in the area A is a state in which no execution time delay occurs in the whole task even when the access to some subcircuits is delayed until a later time, since the access to the delayed subcircuits is enabled together with other subcircuits to be accessed at that time when the power consumption has a margin. On the other hand, the area B is a state in which the subcircuits are accessed within a power close to the Pmax and the access to some subcircuits that is left until a later time affects the execution time of the whole task to a certain level. The Pmax, which becomes a boundary between areas A and B, takes a value (10 W in the example shown in FIG. 13) around the average power AVEP($\infty$) when the chip maximum power of the chip is $\infty$. The execution time of the whole task is extended unavoidably, whereby the limit of the maximum power Pmax of the chip causes the power consumption to be lowered directly when the Pmax value is set to AVEP($\infty$) or less.

As described above, the energy consumption by a whole task processing calculated from the product between the average power AVEP and the execution time EXET does not depend on the Pmax. The AVEP is calculated by excluding the leakage current and the power consumption used for power management.

On the other hand, a leakage current is a current flowing in an off-state transistor. It is generated independently of any task processing. However, as described with reference to FIG. 5 in the first embodiment, each subcircuit in the present invention can be configured so as to be transferred to a power-saving mode according to the state transition frequency. When this configuration is taken, the task processing time can be extended by reducing the Pmax value and each inactive subcircuit can go into the power-saving mode that suppresses the leakage current. Thus, the power consumption caused by the leakage current can also be reduced. Consequently, when the leakage current is taken into consideration and the Pmax is set low, the task processing time is extended and the energy consumption by the whole task processing is reduced.

Where a state identical to that in the twelfth embodiment is set, the Pmax is determined with respect to the average power AVEP($\infty$) when the maximum power is ($\infty$). Consequently, it is the average power when the task processing control is done according to the power consumption of the whole chip. This AVEP($\infty$) size is decided mainly by the chip system configuration and it is not changed much by the content of the subject task.

In the chip state 2 (ST2), an emphasis is put on the chip operation at lower power consumption. The Pmax(ST2) value takes a value in the area B; for example, it assumes Pmax=5 W. In the chip state 3 (ST3), an emphasis is put on the operation of the chip at lower power consumption and at the minimum reduction of the operation speed. The Pmax (ST3) takes a value in the area A; for example, it assumes Pmax=10 W. The influence of a leakage current on an energy consumption can be reduced by controlling the Pmax so as to make the absolute value of (Pmax(ST3)–AVEP($\infty$)) smaller than the absolute value of (Pmax(ST2)–AVEP($\infty$)).

As described above, while the present invention has been described in detail with reference to some preferred embodiments, it is to be understood that modifications will be apparent to those skilled in the art without departing from the spirit of the invention. For example, the specific structure and layout of the circuit shown in FIG. 1 can be varied freely. The present invention can thus apply to a wide variety of chips or systems that employ the chips in each of which the power consumption exceeds the maximum power when all the circuits integrated on the chip are powered or activated.

While a description has been made for a method for controlling the chip power consumption as a resource, the resources to be controlled are not limited only to the chip power consumption. For example, it is also possible to control transistors, gates, or wirings integrated on the chip as such resources when the chip is configured so as to be re-configurable (a chip configured so as to use one and the same transistor or gate as a part for realizing a different function by changing the wiring structure electrically or physically after the fabrication).

According to the present invention, therefore, it is possible to integrate many low threshold voltage MOS transistors and thin gate oxide MOS transistors on one single chip while it has been impossible conventionally to integrate such many MOS transistors due to the power limitation of the chip.

The foregoing invention has been described in the terms of preferred embodiments. However, those skilled, in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of the claimed invention. Accordingly, it is understood that the drawings and the descriptions herein are proffered by way of example only to facilitate comprehension of the invention and should not be construed to limit the scope thereof.

What is claimed is:

1. A semiconductor integrated circuit device, comprising:
   a power control circuit; and
   a plurality of circuit blocks, wherein each of said plurality of circuit blocks has a plurality of states including at least a first state and a second state, further wherein each of said plurality of circuit blocks works in accordance with its function in said first state and rests in said second state, further wherein said power control circuit determines the operation of each of said plurality of circuit blocks so as not to exceed a maximum power consumption of said semiconductor integrated circuit device.

2. The semiconductor integrated circuit device of claim 1, wherein said power control circuit determines the state of at least one of said plurality of circuit blocks according to the power consumption in said first state and the power consumption required in a transition to said first state.

3. The semiconductor integrated circuit device of claim 1, further comprising:
   a main circuit whose power is not controlled by said power control circuit, wherein said power control circuit, upon receiving a request for accessing one of said plurality of circuit blocks from said main circuit and determining to enable said access to said one circuit block, outputs an enable signal to said main circuit, further wherein said one circuit block makes a transition to said first state.

4. The semiconductor integrated circuit device of claim 1, wherein said plurality of circuit blocks further comprise:

a first circuit block; and a second circuit block privileged to access said first circuit block, wherein said power control circuit, upon receiving a request for accessing said first circuit block from said second circuit block and determining to enable said access to said first circuit block, outputs an enable signal to the second circuit, so that said second circuit block makes a transition to said first state.

5. The semiconductor integrated circuit device of claim 1, wherein said power control circuit and said plurality of circuit blocks are housed in a single package.

6. The semiconductor integrated circuit device of claim 1, wherein said power control circuit and said plurality of circuit blocks are integrated on a single semiconductor substrate.

7. The semiconductor integrated circuit device of claim 1, wherein at least one of said plurality of circuit blocks further comprises:

a leakage current control circuit for controlling power consumption by a leakage current; and a charging/discharging power control circuit for controlling power consumption by charging/discharging of a load, wherein power consumption of said at least one circuit block is controlled in accordance with the state of said at least one circuit block by said leakage current control circuit and said charging/discharging power control circuit.

8. The semiconductor integrated circuit device of claim 7, further comprising:

a clock distribution system, wherein said charging/discharging power control circuit of said at least one circuit block controls power consumption by charging/discharging of a load, by controlling the clock frequency distributed to said at least one circuit block.

9. The semiconductor integrated circuit device of claim 1, further comprising:

a non-volatile memory, wherein said maximum power consumption is stored in said non-volatile memory.

10. The semiconductor integrated circuit device of claim 1, wherein each of said plurality of circuit blocks is configured by a MOS transistor whose threshold voltage is 0.2V or less.

11. The semiconductor integrated circuit device of claim 1, wherein each of said plurality of circuit blocks is configured by a MOS transistor whose gate oxide thickness is 4 nm or less.

12. The semiconductor integrated circuit device of claim 1, further comprising:

a state transition limiting circuit for limiting the state transition frequency of at least one of said plurality of circuit blocks under a predetermined value.

13. A semiconductor integrated circuit device, comprising:

a first circuit block having a plurality of states with different power consumption values;

a second circuit block privileged to access said first circuit block; and a power control circuit, wherein said second circuit block is adapted to issue a request for accessing said first circuit block to said power control circuit, further wherein said power control circuit is adapted to determine whether to enable said access to said first circuit block according to a predetermined maximum power consumption, and further wherein said second circuit block is adapted to access said first circuit block when said power control circuit enables said access to said first circuit block.

14. The semiconductor integrated circuit device of claim 13, wherein said first circuit block comprises:

a leakage current control circuit for controlling power consumption by a leakage current; and a charging/discharging power control circuit for controlling power consumption by charging/discharging of a load, wherein said plurality of states of said first circuit block include a state in which either power consumption by said leakage current or power consumption by charging/discharging of said load in said first circuit block is limited.

15. The semiconductor integrated circuit device of claim 13, wherein said power control circuit, when enabling said access to said first circuit block, outputs a signal for enabling said access to said first circuit block to said second circuit block.

16. The semiconductor integrated circuit device of claim 13, wherein said power control circuit determines whether to enable said access to said first circuit block according to the power consumption required for said first circuit block to work in accordance with its function and the power consumption required for said first circuit block to make a transition to a state for enabling an access from said second circuit block.

* * * * *